(12) United States Patent
Takahagi et al.

(10) Patent No.: US 10,475,727 B2
(45) Date of Patent: Nov. 12, 2019

(54) SEMICONDUCTOR DEVICE, MANUFACTURING METHOD FOR SEMICONDUCTOR DEVICE, AND ELECTRODE PLATE

(71) Applicant: TOYOTA JIDOSHA KABUSHIKI KAISHA, Toyota-shi, Aichi-ken (JP)

(72) Inventors: Satoshi Takahagi, Nagakute (JP); Syou Funano, Toyota (JP); Takuya Kadoguchi, Toyota (JP); Yuji Hanaki, Nagoya (JP); Shingo Iwasaki, Toyota (JP); Takanori Kawashima, Anjo (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/923,018

(22) Filed: Mar. 16, 2018

(65) Prior Publication Data
US 2018/0277462 A1    Sep. 27, 2018

(30) Foreign Application Priority Data
Mar. 21, 2017    (JP) .................................. 2017-054815

(51) Int. Cl.
*H01L 23/495*    (2006.01)
*H01L 21/48*    (2006.01)
(Continued)

(52) U.S. Cl.
CPC .... *H01L 23/49513* (2013.01); *H01L 21/4825* (2013.01); *H01L 21/565* (2013.01);
(Continued)

(58) Field of Classification Search
CPC ............. H01L 23/49513; H01L 21/565; H01L 23/49575; H01L 23/4952; H01L 23/49548;
(Continued)

(56) References Cited

U.S. PATENT DOCUMENTS

2005/0253179 A1* 11/2005 Park .................. H01L 27/10852
257/301
2006/0207974 A1* 9/2006 Li ............................ B23H 3/04
219/69.2
(Continued)

FOREIGN PATENT DOCUMENTS

| JP | 2007-103909 A | 4/2007 |
| JP | 2008-166626 A | 7/2008 |

(Continued)

*Primary Examiner* — Bo Fan
(74) *Attorney, Agent, or Firm* — Sughrue Mion, PLLC

(57) ABSTRACT

A semiconductor device includes an electrode plate, a metallic member, and solder connecting the metallic member with the electrode plate. On a surface of the electrode plate, a first groove and a group of second grooves are provided. The first groove has first to fourth linear parts. The group of second grooves is arranged within a range surrounded by the first groove, and has end portions on an outer periphery side that are connected with the first groove. The group of second grooves includes first to fourth sets. Each of the sets includes a plurality of second grooves connected with the first to fourth linear parts. When the metallic member is seen in a lamination direction of the electrode plate and the metallic member, an outer peripheral edge of a region of the metallic member, the region being connected with the solder, goes across the first to fourth sets.

6 Claims, 6 Drawing Sheets

(51) Int. Cl.
  *H01L 21/56* (2006.01)
  *H01L 23/31* (2006.01)
  *H01L 23/051* (2006.01)
  *H01L 23/00* (2006.01)
(52) U.S. Cl.
  CPC ........ *H01L 23/051* (2013.01); *H01L 23/3114* (2013.01); *H01L 23/4952* (2013.01); *H01L 23/49548* (2013.01); *H01L 23/49562* (2013.01); *H01L 23/49568* (2013.01); *H01L 23/49575* (2013.01); *H01L 24/83* (2013.01); *H01L 24/29* (2013.01); *H01L 24/32* (2013.01); *H01L 2224/26175* (2013.01); *H01L 2224/32225* (2013.01); *H01L 2224/32245* (2013.01); *H01L 2224/33181* (2013.01); *H01L 2224/48091* (2013.01); *H01L 2224/48247* (2013.01); *H01L 2224/73215* (2013.01); *H01L 2224/73265* (2013.01); *H01L 2224/83385* (2013.01); *H01L 2224/83815* (2013.01); *H01L 2924/181* (2013.01)
(58) Field of Classification Search
  CPC . H01L 21/4825; H01L 23/3114; H01L 24/00; H01L 23/49568; H01L 23/49562
  USPC .................................................. 257/675, 296
  See application file for complete search history.

(56) References Cited

U.S. PATENT DOCUMENTS

| | | | |
|---|---|---|---|
| 2007/0057373 A1* | 3/2007 | Okumura | H01L 23/051 257/746 |
| 2007/0114602 A1* | 5/2007 | Saito | H01L 29/7813 257/330 |
| 2007/0218414 A1* | 9/2007 | Harneit | F23D 14/06 431/354 |
| 2016/0225690 A1* | 8/2016 | Kadoguchi | H01L 23/49562 |

FOREIGN PATENT DOCUMENTS

| | | |
|---|---|---|
| JP | 2013-123016 A | 6/2013 |
| JP | 2015-053343 A | 3/2015 |
| JP | 2016-195222 A | 11/2016 |
| WO | 2015/080161 A1 | 6/2015 |

* cited by examiner

SEMICONDUCTOR DEVICE, MANUFACTURING METHOD FOR SEMICONDUCTOR DEVICE, AND ELECTRODE PLATE

INCORPORATION BY REFERENCE

The disclosure of Japanese Patent Application No. 2017-054815 filed on Mar. 21, 2017 including the specification, drawings and abstract is incorporated herein by reference in its entirety.

BACKGROUND

1. Technical Field

The disclosure relates to a semiconductor device, a manufacturing method for the semiconductor device, and an electrode plate.

2. Description of Related Art

A semiconductor device disclosed in Japanese Patent Application Publication No. 2016-195222 (JP 2016-195222 A) includes an electrode plate, a metallic member, and solder that connects the electrode plate and the metallic member. On a surface of the electrode plate, a plurality of ring-shaped grooves, which extend in ring shapes, are provided. A center part of the surface of the electrode plate is surrounded by the multiple ring-shaped grooves. The metallic member is connected with a range, where the plurality of ring-shaped grooves is provided, through the solder.

The foregoing plurality of ring-shaped grooves is provided in order to stop wetting and spreading of the solder. By providing the multiple ring-shaped grooves in the electrode plate, various types of metallic members in different sizes may be soldered to the electrode plate appropriately. For example, a case where three ring-shaped grooves are provided (in other words, a case where a first ring-shaped groove on the outermost periphery side, a second ring-shaped groove provided on an inner periphery side of the first ring-shaped groove, and a third ring-shaped groove provided on an inner periphery side of the second ring-shaped groove are provided) is explained below.

When a metallic member smaller than the third ring-shaped groove is soldered to an electrode plate, the metallic member is soldered to a range on the inner periphery side of the third ring-shaped groove. In this case, solder that overflows from a position between the metallic member and the electrode plate towards the outer periphery side wets and spreads on a surface of the electrode plate towards the outer periphery side. Once the wet and spreading solder reaches the third ring-shaped groove, the wetting and spreading of the solder stops at the third ring-shaped groove. Therefore, unnecessary wetting and spreading of the solder is prevented, and a solder fillet with an appropriate shape is formed.

When a metallic member that is larger than the third ring-shaped groove and smaller than the second ring-shaped groove is soldered to the electrode plate, the metallic member is arranged in a range on the inner periphery side of the second ring-shaped groove so that the metallic member covers the third ring-shaped groove, and the metallic member is soldered to the range on the inner periphery side of the second ring-shaped groove. In this case, wetting and spreading of the solder overflowing from a position between the metallic member and the electrode plate towards the outer periphery side stops at the second ring-shaped groove. Thus, a solder fillet having an appropriate shape is formed.

When a metallic member that is larger than the second ring-shaped groove and smaller than the first ring-shaped groove is soldered to the electrode plate, the metallic member is arranged in a range on the inner periphery side of the first ring-shaped groove so that the metallic member covers the second ring-shaped groove and the third ring-shaped groove, and the metallic member is soldered to a range on the inner periphery side on the first ring-shaped groove. In this case, wetting and spreading of the solder overflowing from a position between the metallic member and the electrode plate towards the outer periphery side stops at the first ring-shaped groove. Therefore, a solder fillet having an appropriate shape is formed.

As stated so far, as long as the metallic member is smaller than the first ring-shaped groove, various metallic members in different sizes can be soldered to the electrode plate.

SUMMARY

In the semiconductor device described in JP 2016-195222 A, there are instances where the metallic member cannot be soldered to the electrode plate suitably when the ring-shaped grooves and the metallic member have specific positional relations. Hereinafter, a positional relation between the third ring-shaped groove and the metallic member is explained as an example. However, the same thing applies to the other ring-shaped grooves. When the metallic member has a generally the same size as that of the third ring-shaped groove, an outer peripheral edge of the metallic member is arranged adjacent to the third ring-shaped groove. In this case, wetting and spreading of solder that overflows from a position between the metallic member and the electrode plate towards the outer periphery side may stop at the third ring-shaped groove, or may pass across the third ring-shaped groove and reach the outer periphery side. A wetting and spreading range of solder differs depending on a position, and this can cause a distorted shape of the solder. Further, when the metallic member has generally the same size as that of the third ring-shaped groove, there are instances where a part of the metallic member sticks out from the third ring-shaped groove to the outer side due to an error. Moreover, when, for example, a rectangular metallic member is used for a square third ring-shaped groove, there are instances where a part of the metallic member sticks out from the third ring-shaped groove to the outer side. When a part of the metallic member sticks out from the third ring-shaped groove to the outer side as described above, wetting and spreading of the solder reaches the second ring-shaped groove at a position where the metallic member sticks out from the third ring-shaped groove to the outer side, and, at a position where the metallic member does not stick out from the third ring-shaped groove to the outer side, the solder stops at the third ring-shaped groove. Because of this, the solder falls into a distorted shape. When the solder has a distorted shape as described above, high stress tends to be generated inside the solder, reducing reliability of the solder. At the time of mass-production, the shape of the solder is not stabilized and quality of the solder varies widely. As stated so far, according to the technology described in JP 2016-195222 A, there are instances where a wetting and spreading range of solder cannot be controlled accurately.

In JP 2016-195222 A, the block-shaped metallic member is soldered to the electrode plate. However, a similar problem happens when other types of metallic members (for example, a surface electrode of a semiconductor chip and so on) are soldered to the electrode plate. In this specification, provided is a technology that makes it possible to solder a wider variety of metallic members to an electrode plate appropriately.

A first aspect of the disclosure includes an electrode plate, a metallic member, and solder that connects the metallic member with the electrode plate. On a surface of the electrode plate, a first groove and a group of second grooves are provided. The first groove has a first linear part, a second linear part, a third linear part, and a fourth linear part extending along respective sides of a rectangular shape, and extends in a ring shape. The group of second grooves is arranged within a range surrounded by the first groove, and has end portions on an outer periphery side connected with the first groove. The group of second grooves includes a plurality of second grooves. The group of second grooves includes a first set having the plurality of second grooves connected with the first linear part, a second set having the plurality of second grooves connected with the second linear part, a third set having the plurality of second grooves connected with the third linear part, and a fourth set having the plurality of second grooves connected with the fourth linear part. The solder connects a surface of the electrode plate within the range and a surface of the metallic member, the surface of the metallic member facing the surface of the electrode plate. When the metallic member is seen in a lamination direction of the electrode plate and the metallic member, an outer peripheral edge of a region of the metallic member, the region being connected with the solder, is arranged so as to go across the first set, the second set, the third set, and the fourth set.

As long as the first groove has a structure that the first to fourth linear parts extending along respective sides of a rectangular shape are provided, and extends in a ring shape, the remaining part may be in any shape. For example, the first groove may have a rectangular shape with chamfered corners.

In this semiconductor device, the first groove and the group of second grooves are provided in the surface of the electrode plate. The group of second grooves is arranged within the range surrounded by the first groove, and their end portions on the outer periphery side are connected with the first groove. Further, the outer peripheral edge of the region of the metallic member, the region being connected with the solder, is arranged so as to go across the group of second grooves (in other words, the first set, the second set, the third set, and the fourth set). Therefore, the solder that overflows from a position between the metallic member and the electrode plate to the outer periphery side while soldering wets and spreads easily to the outer periphery side along the group of second grooves, and thus easily reaches the first groove. Once the solder reaches the first groove, the solder flows into the first groove, and wetting and spreading of the solder to the outer periphery side of the first groove is restrained. In this semiconductor device, on an inner periphery side of the first groove, wetting and spreading of the solder is promoted by the group of second grooves, and wetting and spreading of the solder to the outer side of the first groove is restrained by the first groove. Therefore, as long as the outer peripheral edge of the region of the metallic member, the region being connected with the solder, is arranged so as to go across the group of second grooves, wet and spreading solder reaches the first groove in a stable manner and the solder is stopped at the first groove regardless of the size and shape of the metallic member. According to this structure, a wider variety of metallic members can be soldered to an electrode plate suitably.

In the first aspect of the disclosure, the electrode plate may include a flat surface in a center of the range, and the flat surface does not have to have the group of second grooves.

In the first aspect of the disclosure, each of the second grooves may not be connected with the other second grooves. That is, the second grooves of the first set may be not connected with the second grooves of the second to fourth sets. The solder may be covered by resin.

In the first aspect of the disclosure, each of the second grooves may be connected perpendicularly with the first groove.

In the first aspect of the disclosure, a semiconductor chip may be connected with a surface of the metallic member on the opposite side of the electrode plate through solder.

In the first aspect of the disclosure, the metallic member may be a surface electrode of a semiconductor chip.

A second aspect of the disclosure relates to a manufacturing method for a semiconductor device. The second aspect of the disclosure includes connecting a metallic member with an electrode plate through solder. On a surface of the electrode plate, a first groove and a group of second grooves are provided. The first groove has a first linear part, a second linear part, a third linear part, and a fourth linear part extending along respective sides of a rectangular shape, and extends in a ring shape. The group of second grooves is arranged within a range surrounded by the first groove, and has end portions on an outer periphery side that are connected with the first groove. The group of second grooves includes a plurality of second grooves, and the group of second grooves includes a first set having the plurality of second grooves connected with the first linear part, a second set having the plurality of second grooves connected with the second linear part, a third set having the plurality of second grooves connected with the third linear part, and a fourth set having the plurality of second grooves connected with the fourth linear part. When connecting the metallic member with the electrode plate through the solder, the electrode plate and the metallic member are made to face each other, and, when the metallic member is seen in a lamination direction of the electrode plate and the metallic member, an outer peripheral edge of a region of the metallic member, the region being connected with the solder, is arranged so as to go across the first set, the second set, the third set, and the fourth set, and, in this state, the range and the region are connected with each other by the solder.

A third aspect of the disclosure relates to an electrode plate for connecting a semiconductor chip. The third aspect of the disclosure includes the electrode plate, and, on a surface of the electrode plate, a first groove and a group of second grooves are provided. The first groove has a first linear part, a second linear part, a third linear part, and a fourth linear part extending along respective sides of a rectangular shape, and extends in a ring shape. The group of second grooves is arranged within a range surrounded by the first groove and has end portions on an outer periphery side that are connected with the first groove. The group of second grooves includes a plurality of second grooves, and the group of second grooves includes a first set having the plurality of second grooves connected with the first linear part, a second set having the plurality of second grooves connected with the second linear part, a third set having the plurality of second grooves connected with the third linear part, and a fourth set having the plurality of second grooves connected with the fourth linear part. The range is for joining the solder.

This specification also proposes a method for manufacturing a semiconductor device by connecting a metallic member with an electrode plate having a first groove and a group of second grooves through solder, as well as an electrode plate used for the method.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
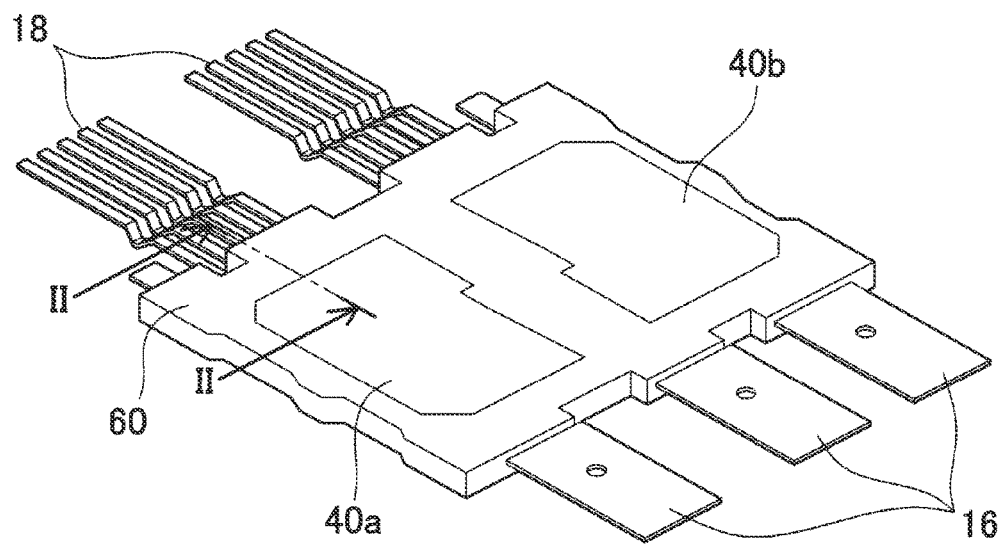
FIG. 1 is a perspective view of a semiconductor device.
Figure 5:
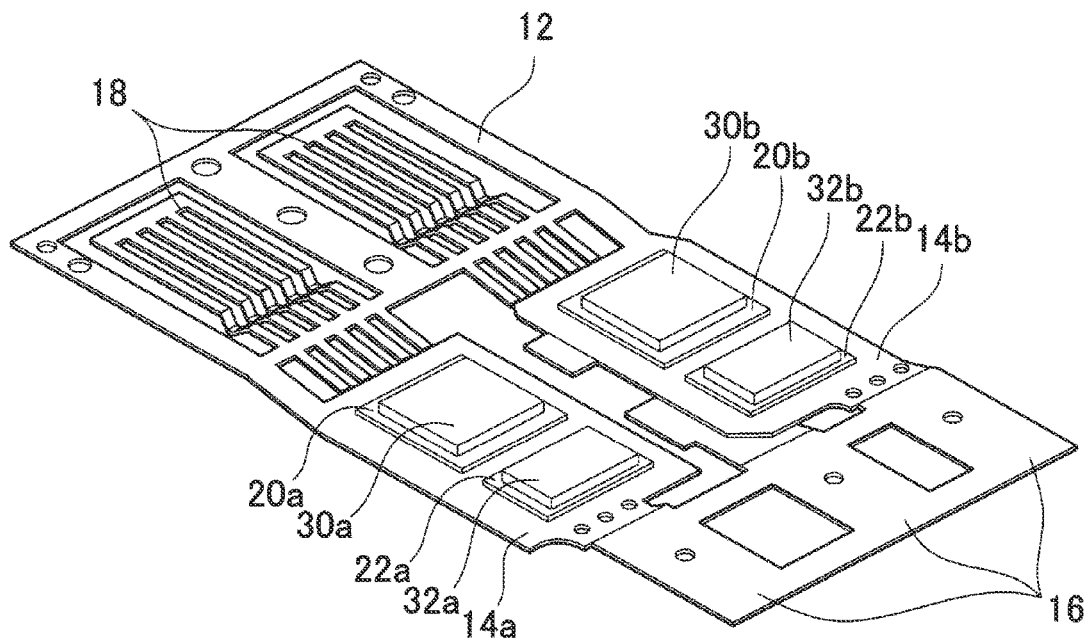
FIG. 5 is an explanatory view of a manufacturing process for the semiconductor device.
Figure 6:
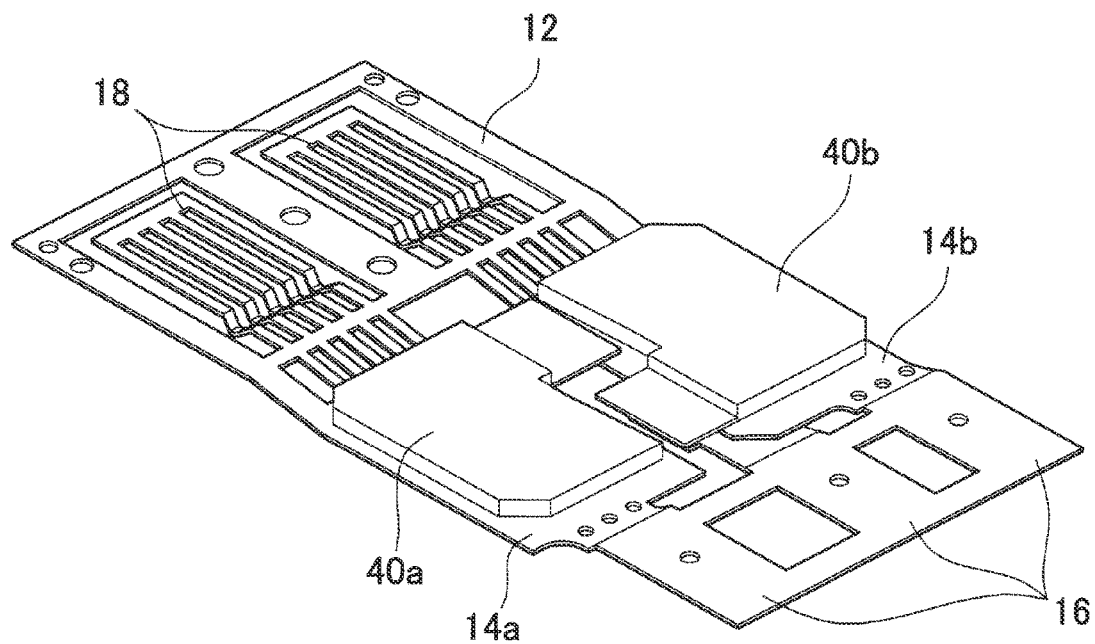
FIG. 6 is an explanatory view of a manufacturing process for the semiconductor device.

A semiconductor device 10 shown in FIG. 1 according to an embodiment has a resin layer 60 serving as an insulator, and main terminals 16 and signal terminals 18 projecting outwardly from the resin layer 60. FIG. 5 and FIG. 6 show manufacturing processes for the semiconductor device 10. As shown in FIG. 5, before forming the resin layer 60, the main terminals 16 and the signal terminals 18 are connected with each other. Hereinafter, a part that connects the main terminals 16 and the signal terminals 18 with each other is referred to as a lead frame 12. The lead frame 12 includes heat sinks 14a, 14b. In FIG. 1, the heat sinks 14a, 14b are covered by the resin layer 60. As shown in FIG. 5, an insulated gate bipolar transistor (IGBT) 20a and a diode 22a are arranged on the heat sink 14a. A metal block 30a is arranged on the IGBT 20a. A metal block 32a is arranged on the diode 22a. The electrode plate 40a shown in FIG. 6 is arranged on the metal blocks 30a, 32a shown in FIG. 5. As shown in FIG. 5, an IGBT 20b and a diode 22b are arranged the heat sink 14b. A metal block 30b is arranged on the IGBT 20b. A metal block 32b is arranged on the diode 22b. An electrode plate 40b in FIG. 6 is arranged on the metal blocks 30b, 32b shown in FIG. 5. The metal blocks 30a, 30b, 32a, 32b and the electrode plates 40a, 40b are made of copper. In FIG. 1, the IGBTs 20a, 20b, the diodes 22a, 22b, the metal blocks 30a, 30b, 32a, 32b, and the electrode plates 40a, 40b are covered by the resin layer 60. However, upper surfaces of the electrode plates 40a, 40b are exposed from the resin layer 60. Main parts of the IGBTs 20a, 20b and the diodes 22a, 22b are connected with other members, respectively, by solder. Connection structures of the IGBTs 20a, 20b and the diodes 22a, 22b are generally the same. Therefore, the connection structure of the IGBT 20a is explained.

Figure 2:
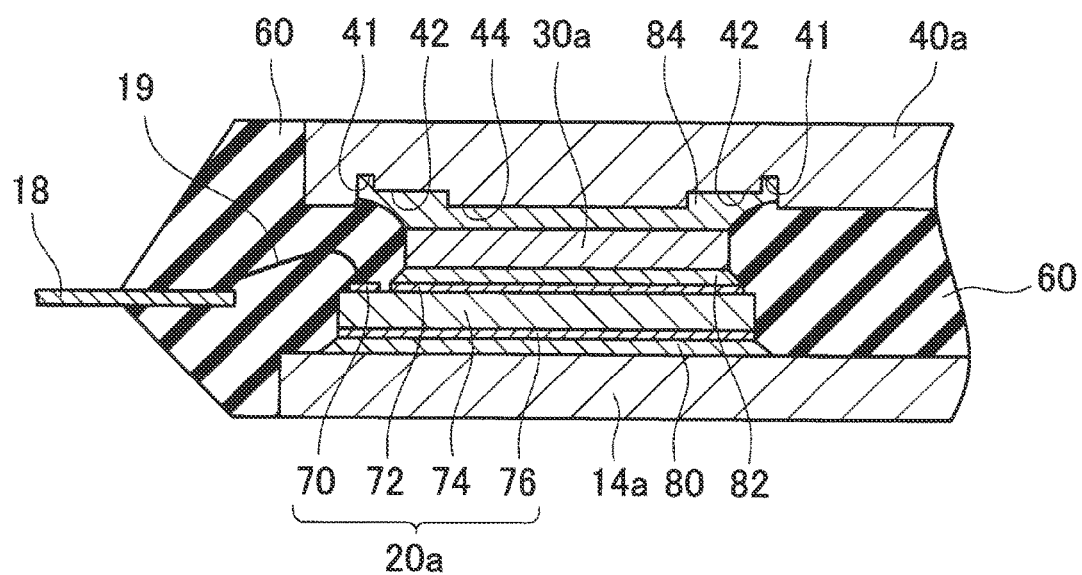
FIG. 2 is a sectional view of the semiconductor device taken along the line II-II in FIG. 1 and FIG. 3.

As shown in FIG. 2, the IGBT 20a includes a signal electrode 70, an emitter electrode 72, a semiconductor substrate 74, and a collector electrode 76. On an upper surface of the semiconductor substrate 74, the signal electrode 70 and the emitter electrode 72 are arranged. Although FIG. 2 shows one signal electrode 70, the plurality of signal electrodes 70 is provided on the upper surface of the semiconductor substrate 74. On a lower surface of the semiconductor substrate 74, the collector electrode 76 is arranged. The IGBT 20a is arranged on the heat sink 14a. The collector electrode 76 is connected with an upper surface of the heat sink 14a by solder 80. The plurality of signal terminals 18 is arranged on a side of the IGBT 20a. Each of the signal electrodes 70 of the IGBT 20a is connected with the corresponding signal terminal 18 by a bonding wire 19. The metal block 30a is arranged on the emitter electrode 72 of the IGBT 20a. The emitter electrode 72 is connected with a lower surface of the metal block 30a by solder 82. The electrode plate 40a is arranged on the metal block 30a. An upper surface of the metal block 30a is connected with a lower surface of the electrode plate 40a by solder 84. The upper surface of the heat sink 14a, the IGBT 20a, the metal block 30a, and a lower surface of the electrode plate 40a are covered by the resin layer 60.

Figure 3:
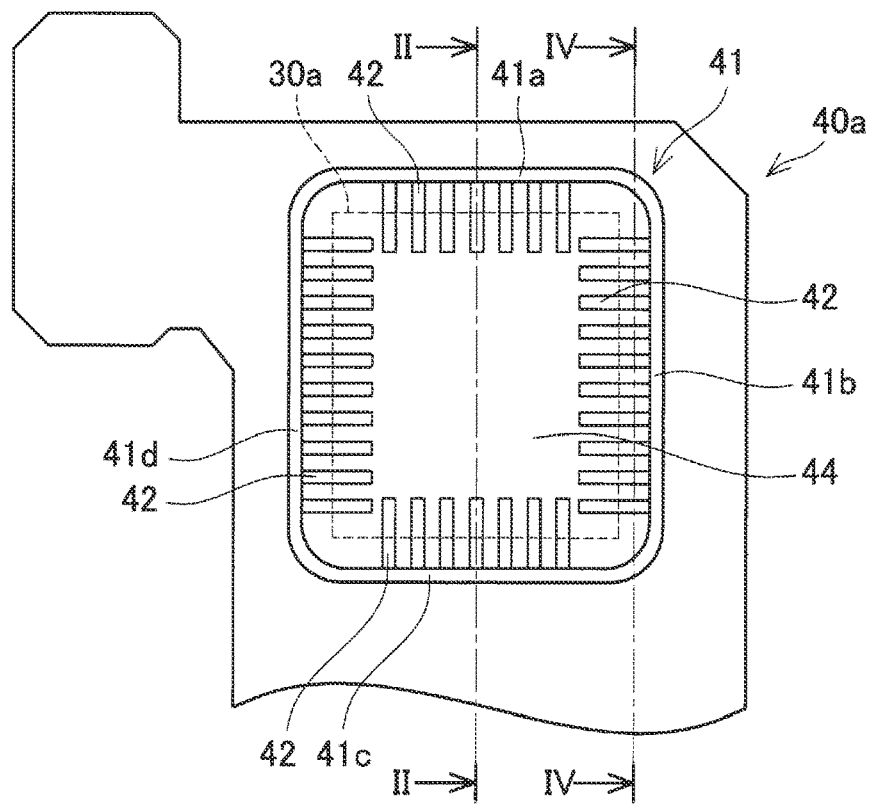
FIG. 3 is a plan view of a lower surface of an electrode plate.

As shown in FIG. 3, a first groove 41 extending in a ring shape, and a plurality of second grooves 42 extending linearly are provided in the lower surface of the electrode plate 40a. The first groove 41 extends along a rectangular shape with rounded corners, and has four linear parts 41a to 41d. The plurality of second grooves 42 is provided inside a range surrounded by the first groove 41. The plurality of second grooves 42 extends from the center side towards an outer periphery side of the range surrounded by the first groove 41. An end portion of each of the second grooves 42 on the outer periphery side is connected with the first groove 41. The plurality of second grooves 42 is connected with the corresponding linear parts 41a to 41d of the first groove 41. Hereinafter, the plurality of second grooves 42 connected with the first linear part 41a is referred to as a first set, the plurality of second grooves 42 connected with the second linear part 41b is referred to as a second set, the plurality of second grooves 42 connected with the third linear part 41c is referred to as a third set, and the plurality of second grooves 42 connected with the fourth linear part 41d is referred to as a fourth set. Each of the second grooves 42 of the first set extends perpendicularly to the first linear part 41a. Each of the second grooves 42 of the second set extends perpendicularly to the second linear part 41b. Each of the second grooves 42 of the third set extends perpendicularly to the third linear part 41c. Each of the second grooves 42 of the fourth set extends perpendicularly to the fourth linear part 41d. As shown in FIG. 2, the first groove 41 is deeper than the second grooves 42. As shown in FIG. 3, each of the second grooves 42 is not connected with other grooves except the parts that are connected with the first groove 41. This means that each of the second grooves 42 is independent from the other second grooves 42. At the center of the range surrounded by the first groove 41, a flat surface 44 is provided, in which no second grooves 42 are provided.

A broken line in FIG. 3 shows a position of the metal block 30a. When the metal block 30a is seen in a lamination direction of the metal block 30a and the electrode plate 40a, the metal block 30a is arranged within the range surrounded by the first groove 41. When the metal block 30a is seen in the lamination direction as shown in FIG. 3, an outer peripheral edge of the metal block 30a is arranged so as to go across (intersect) the second grooves 42 of the first to fourth sets. As shown in FIG. 2, the solder 84 is joined to the generally entire upper surface of the metal block 30a. Also, the solder 84 is joined to the electrode plate 40a in the generally entire range surrounded by the first groove 41. The solder 84 is joined to an inner surface of the first groove 41 and an inner surface of each of the second grooves 42.

Figure 4:
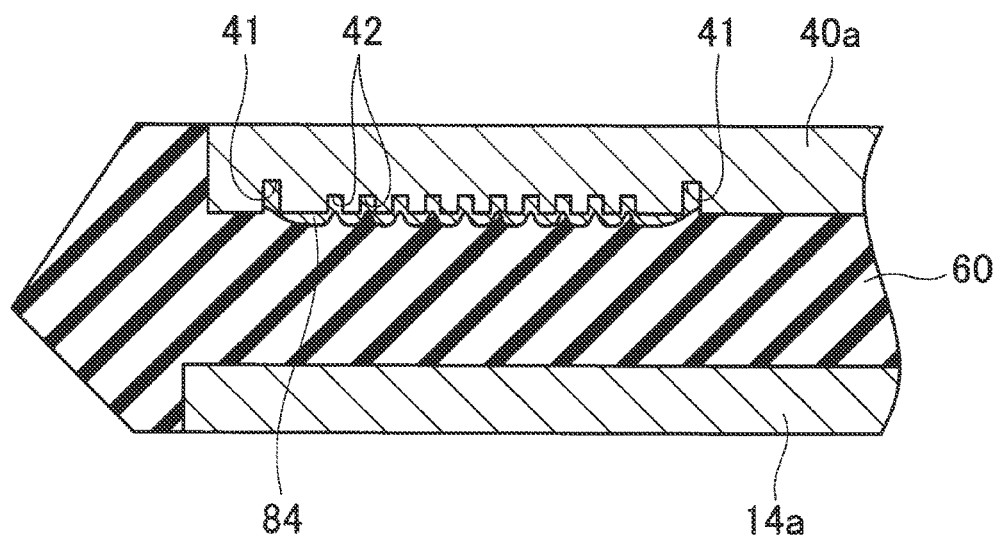
FIG. 4 is a sectional view of the semiconductor device taken along the line IV-IV in FIG. 3.

FIG. 4 is a sectional view of the semiconductor device 10 taken along the line IV-IV in FIG. 3. FIG. 4 shows a section of the solder 84 that covers a range that does not overlap the metal block 30a within the range surround by the first groove 41 in FIG. 3. In the range shown in FIG. 4, recesses and projections are formed in a surface of the solder 84 along the second grooves 42. Since there are the recesses and projections in the surface of the solder 84, the resin layer 60 enters the recessed parts in the surface of the solder 84. Because of this, it is unlikely that the resin layer 60 is separated from the solder 84, and it is thus possible for the resin layer 60 to protect the IGBT 20a and so on suitably.

Next, a manufacturing method for the semiconductor device 10 is explained. First of all, as shown in FIG. 5, the IGBTs 20a, 20b, the diodes 22a, 22b, the metal blocks 30a, 30b, 32a, 32b are soldered onto the heat sinks 14a, 14b of the lead frame 12. To be in more detail, a solder sheet for the solder 80, the IGBT 20a, and a solder sheet for the solder 82, and the metal block 30a are laminated in this order on the heat sink 14a. For the IGBT 20b and the diodes 22a, 22b, each of the members is laminated in a similar manner. Next, the lead frame 12 is heated in a reflow furnace. Then, each of the solder sheets melts and then is solidified. As shown in FIG. 2, when the solder sheet for the solder 80 melts and then is solidified, the solder 80 is joined to the heat sink 14a and the collector electrode 76. Therefore, the heat sink 14a and the collector electrode 76 are connected with each other by the solder 80. When the solder sheet for the solder 82 melts and then is solidified, the solder 82 is joined to the emitter electrode 72 and the metal block 30a. Therefore, the emitter electrode 72 and the metal block 30a are connected with each other by the solder 82. The IGBT 20b and the diodes 22a, 22b are also connected with each of the members through the solder in a similar manner.

Next, each of the signal electrodes 70 of the IGBTs 20a, 20b is connected with the corresponding signal terminal 18 through the bonding wire 19.

Figure 7:
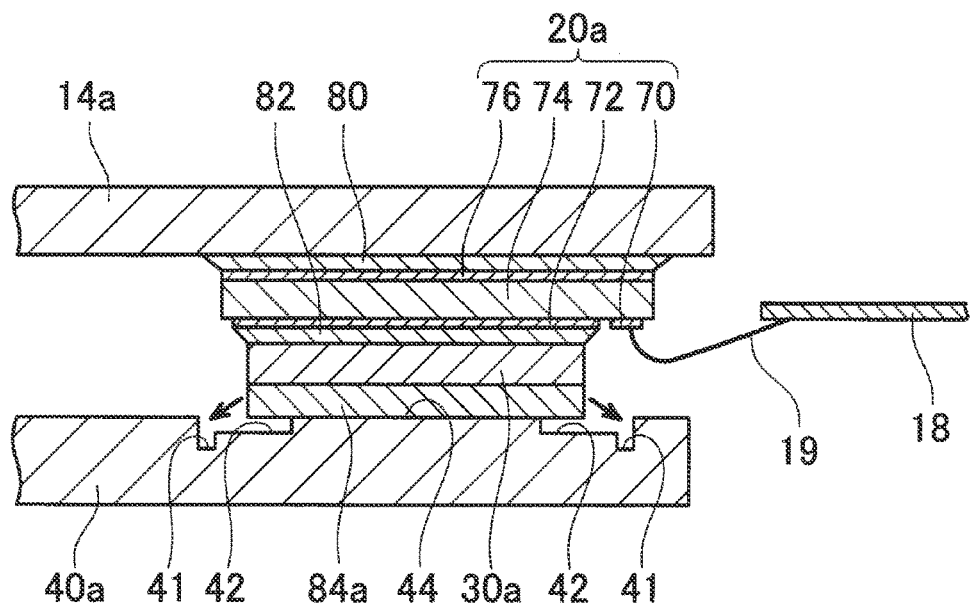
FIG. 7 is an explanatory view of a manufacturing process for the semiconductor device.

Next, as shown in FIG. 6, the electrode plate 40a is connected with the metal blocks 30a, 32a, and the electrode plate 40b is connected with the metal blocks 30b, 32b. Since methods for connecting the electrode plates with the metal blocks are generally the same, the method for connecting the electrode plate 40a with the metal block 30a is explained. First of all, as shown in FIG. 7, the electrode plate 40a is arranged so that a surface on the side where the first groove 41 and the second grooves 42 are provided faces upward. Next, a solder sheet 84a is arranged on the surface in which the first groove 41 and the second grooves 42 are provided. Further, a semi-finished part that is assembled as shown in FIG. 5 is arranged on top of the solder sheet 84a. Here, the metal block 30a is brought into contact with the upper surface of the solder sheet 84a. Thus, the solder sheet 84a is sandwiched between the metal block 30a and the electrode plate 40a. As shown in FIG. 3, when the metal block 30a is seen in the lamination direction, the metal block 30a is arranged within the range surrounded by the first groove 41 so that the outer peripheral edge of the metal block 30a intersects the second grooves 42 of the first to fourth sets. The solder sheet 84a is arranged only within a range immediately below the metal block 30a, and is not arranged on the outer periphery side of the metal block 30a.

Figure 8:
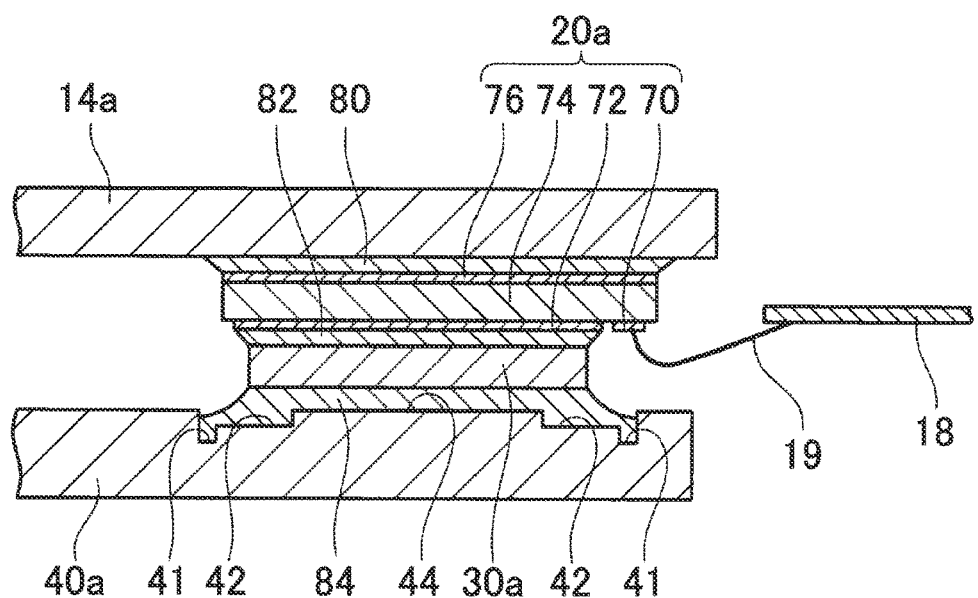
FIG. 8 is an explanatory view of a manufacturing process for the semiconductor device.

Next, the laminate shown in FIG. 7 is heated in a reflow furnace. Then, the solder sheet 84a melts. The melted solder wets and spreads from the range immediately below the metal block 30a towards the outer periphery side of the range. A part of the solder flows into the second grooves 42 as shown by arrows in FIG. 7. The solder flown into the second groove 42 flows towards the outer periphery side. Further, led by the solder inside the second grooves 42, the solder outside the second grooves 42 (in other words, on the surface of the electrode plate 40a adjacent to the second grooves 42) also flows towards the outer periphery side. This means that the second grooves 42 promote wetting and spreading of the solder towards the outer periphery side. Once the solder reaches the first groove 41, the solder flows into the first groove 41. This restrains wetting and spreading of the solder towards the outer periphery side of the first groove 41. Therefore, as shown in FIG. 8, the solder 84 wets and spreads in the generally entire range surrounded by the first groove 41. Thereafter, once the laminate cools down, the solder 84 is solidified. The solder 84 connects the metal block 30a and the electrode plate 40a with each other.

As shown in FIG. 4, on the surface of the solder 84 within the range that is not covered by the metal block 30a, the recesses and projections are formed along the second grooves 42.

Further, as shown in FIG. 8, in the center part of the range surrounded by the first groove 41 (immediately below the center part of the metal block 30a), the flat surface 44 is provided, where no second grooves 42 are formed. Therefore, a thickness of the solder 84 between the flat surface 44 and the metal block 30a becomes small. Thermal conductivity of the solder 84 is lower than thermal conductivity of the metal block 30a and the electrode plate 40a. Hence, by reducing the thickness of the solder 84 between the electrode plate 40a and the metal block 30a by providing the flat surface 44, it is possible to reduce heat resistance between the electrode plate 40a and the metal block 30a.

Even when the amount of the solder 84 is small, the second grooves 42 promote wetting and spreading of the solder. Therefore, wetting and spreading of the solder happens in the generally entire range surrounded by the first groove 41. Further, when the amount of the solder 84 is large, excessive solder is absorbed within the first groove 41. Therefore, it is possible to restrain the excessive solder from crawling up a side surface of the metal block 30a. As explained so far, since wetting and spreading of the solder happens suitably in the generally entire range surrounded by the first groove 41 regardless of the amount of the solder 84, the shape of the fillet of the solder 84 is stabilized. Therefore, quality of the solder 84 is stabilized.

Figure 9:
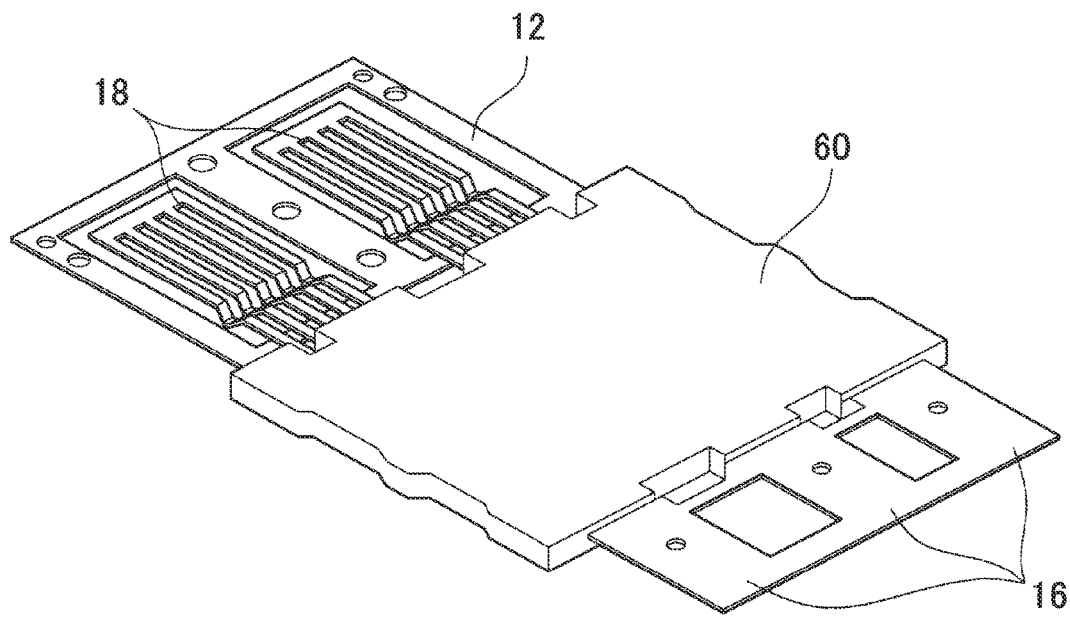
FIG. 9 is an explanatory view of a manufacturing process for the semiconductor device.

Next, as shown in FIG. 9, the resin layer 60 is formed by injection molding. The resin layer 60 seals the heat sinks 14a, 14b, the IGBTs 20a, 20b, the diodes 22a, 22b, the metal blocks 30a, 30b, 32a, 32b, and the electrode plates 40a, 40b. At this time, as shown in FIG. 4, the resin layer 60 flows into the recessed parts in the surface of the solder 84. Therefore, a contact area of the resin layer 60 with the solder 84 becomes large, thus making it difficult for the resin layer 60 to separate from the solder 84.

Figure 10:
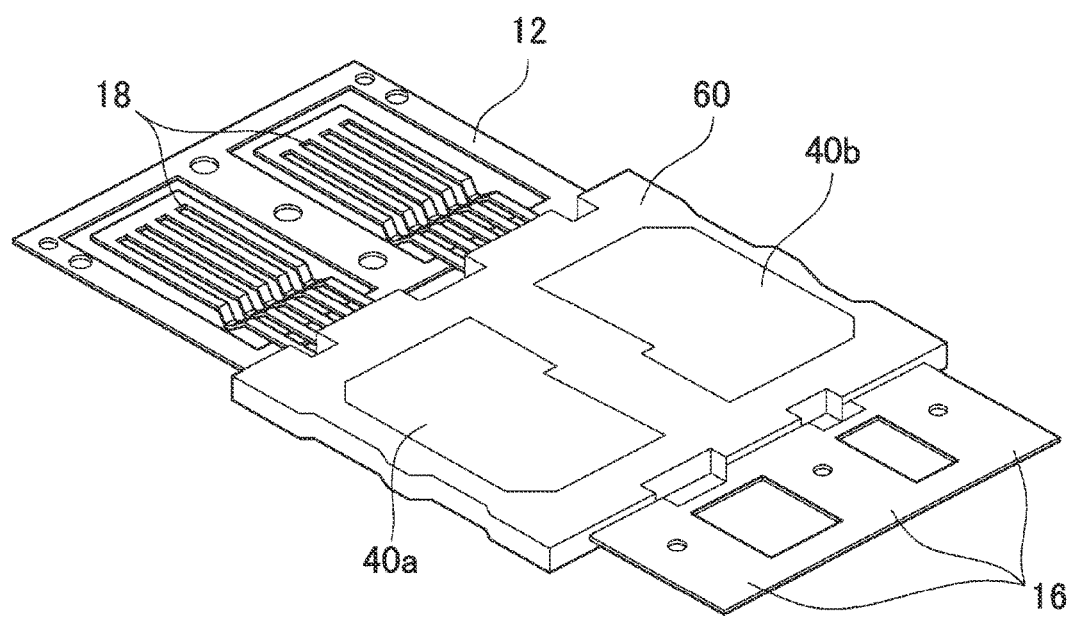
FIG. 10 is an explanatory view of a manufacturing process for the semiconductor device.

Next, as shown in FIG. 10, by cutting an upper surface of the resin layer 60, the electrode plates 40a, 40b are exposed on the upper surface of the resin layer 60. Also, although not shown, by cutting a lower surface of the resin layer 60, the heat sinks 14a, 14b are exposed on the lower surface of the resin layer 60.

Next, as shown in FIG. 1, by cutting unnecessary parts of the lead frame 12, the main terminals 16 and the signal terminals 18 are separated from each other. Thus, the semiconductor device 10 shown in FIG. 1 is completed.

In the above-described method for soldering the metal block 30a and the electrode plate 40a, the entire upper surface of the metal block 30a is connected with the solder 84 as shown in FIG. 2, and the outer peripheral edge of the metal block 30a (or an outer peripheral edge of the upper surface of the metal block 30a connected with the solder 84) is arranged so as to go across the second grooves 42 of the first to fourth sets as shown in FIG. 3. As explained so far, as long as the outer peripheral edge of the region of the metal blocks 30, the region being connected with the solder 84, is arranged so as to go across the second grooves 42 of the first to fourth sets, wetting and spreading of the solder 84 happens in the generally entire range surrounded by the first groove 41. Therefore, even in a case where metal blocks having different sizes and shapes from those of the metal block 30a shown in FIG. 3 are used, it is possible to join the solder 84 to the generally entire range surrounded by the first groove 41 suitably as long as an outer peripheral edge of a region of the metal blocks 30, the region being connected with the solder 84, is arranged so as to go across the second grooves 42 of the first to fourth sets. This means that a metal block having any size and shape can be soldered suitably as long as the size of the region of the metal block connected with the solder 84 is larger than the size of the flat surface 44 and smaller than the size of the first groove 41.

Further, even if the position of the metal block 30a is displaced due to an error, it is possible to join the solder 84 to the generally entire range surrounded by the first groove 41 suitably as long as an outer peripheral edge of a region of the metal blocks 30, the region being connected with the solder 84, is arranged so as to go across the second grooves 42 of the first to fourth sets. Therefore, even if there is variation in installation positions of the metal blocks 30a when the semiconductor devices 10 are mass-produced, the fillet shapes of the solder 84 are stable. Thus, it is possible to stabilize the quality of the solder 84.

As explained so far, according to the technique disclosed in this specification, in various cases with different sizes, shapes, and arrangement positions of the metal blocks, it is possible to solder metal blocks to the electrode plates 40a suitably.

Figure 11:
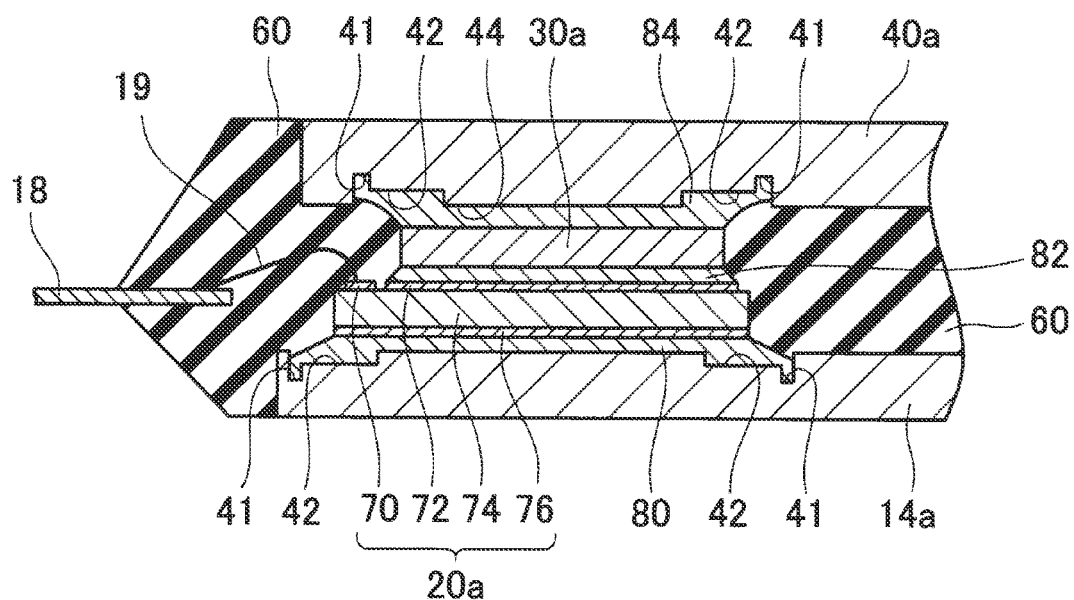
FIG. 11 is a sectional view corresponding to FIG. 2, and shows a semiconductor device according to a modification.

According to the foregoing embodiment, the first groove and the second grooves are formed in the area where the metal block 30a and the electrode plate 40a are connected with each other. However, the first groove and the second grooves may be provided in an area where other metallic member and electrode plate are connected with each other. For example, as shown in FIG. 11, the first groove 41 and the second grooves 42 may be provided in an area where the collector electrode 76 (a type of a metallic member) and the heat sink 14a (a type of an electrode plate) are connected with each other (in other words, a surface of the heat sink 14a).

Figure 12:
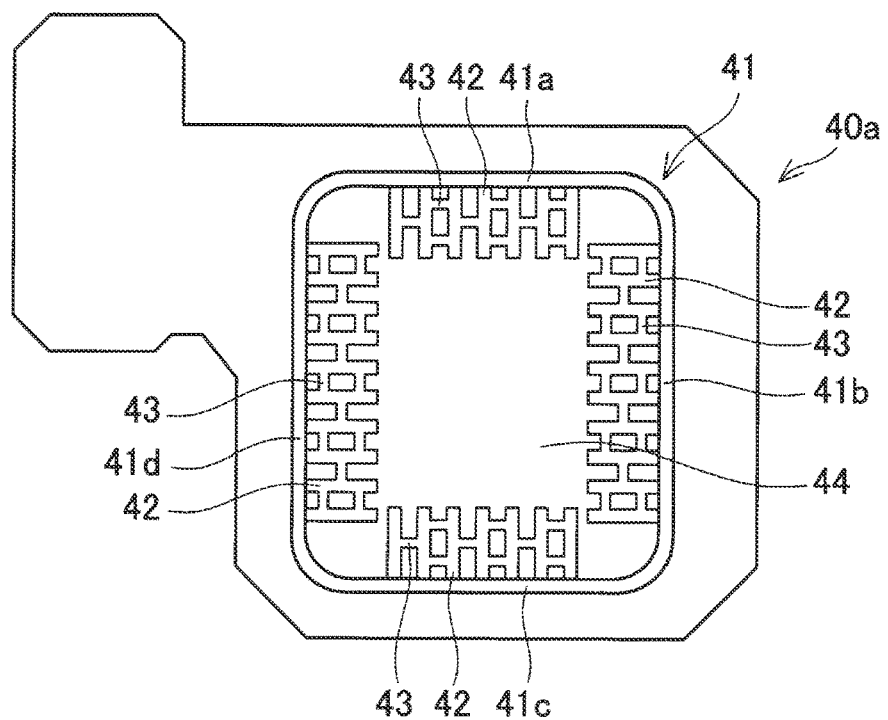
FIG. 12 is a plan view corresponding to FIG. 3, and shows an electrode plate according to a modification.

Also, in the foregoing embodiment, as shown in FIG. 3, each of the second grooves 42 is independent. However, for example, as shown in FIG. 12, the second grooves 42 may be connected with each other by connection grooves 43 in a part other than the first groove 41. However, when the second grooves 42 are connected with each other by the connection grooves 43 as shown in FIG. 12, a flow of molten resin is easily disturbed near areas surrounded by the second grooves 42 and the connection grooves 43 when forming the resin layer 60, and this causes voids easily within the resin layer 60. Therefore, as shown in FIG. 3, it is preferred that the second grooves are independent from each other.

Further, in the foregoing embodiment, as shown in FIG. 2, the entire upper surface of the metal block 30a is connected with the solder 84. However, a part of the upper surface of the metal block 30a may be connected with the solder 84. In this case, it is only necessary that the outer peripheral edge of the region connected with the solder 84 is arranged so as to go across the second grooves 42 of the first set, the second set, the third set, and the fourth set. In this case, the rest of the part of the metal block 30a (the part away from the solder 84) may extend to the outer side of the range surrounded by the first groove 41.

The relations between the components of the foregoing embodiment and components of claims are explained. The metal block 30a of the embodiment is an example of a metallic member in claims. The upper surface of the metal block 30a in the embodiment is an example of a region of the metallic member, the region being connected with solder in claims. The IGBT 20a in the embodiment is an example of a semiconductor chip in claims.

Technical elements disclosed in this specification are listed below. The following technical elements are useful independently from each other.

In the semiconductor device disclosed in this specification as an example, the electrode plate may include a flat surface, where no second grooves are provided, in a center of a range surrounded by the first groove.

According to this structure, since the thickness of the solder becomes small in the center of the range, it is possible to reduce heat resistance between the metallic member and the electrode plate.

In the semiconductor device disclosed in this specification as an example, each of the second grooves is not connected with the other second grooves except for the first groove, and the solder may be covered by resin.

According to this structure, it is possible to restrain voids from being made in the resin.

The detailed explanation regarding the embodiment has been given. However, it is an only an example, and does not limit the scope of claims. Techniques described in the scope of claims include various modifications and changes of the specific examples given above. The technical elements explained in this specification and the drawings have technical usefulness independently or as various combinations, and are not limited to the combinations described in claims at the time of application. Further, the techniques explained in this specification and the drawings as examples achieve a plurality of objectives simultaneously, and have technical usefulness by achieving one of those objectives.

What is claimed is:

1. A semiconductor device comprising:
   an electrode plate, on a surface of which, a first groove having a rectangular ring shape and a plurality of sets of second grooves are provided,
   the first groove having a first linear part, a second linear part, a third linear part, and a fourth linear part extending along respective four sides of the rectangular ring shape,
   the plurality of sets of second grooves being arranged within a range surrounded by the fours sides of the first groove and having end portions on an outer periphery side that are connected with the first groove, each of the plurality of sets of second grooves including a plurality of second grooves, and the plurality of sets of second grooves including:
- a first set of second grooves having a plurality of second grooves connected with the first linear part of the first groove,
- a second set of second grooves having a plurality of second grooves connected with the second linear part of the first grooves,
- a third set of second grooves having a plurality of second grooves connected with the third linear part of the first groove, and
- a fourth set of second grooves having a plurality of second grooves connected with the fourth linear part of the first groove;

a metallic member; and solder that connects a surface of the electrode plate within the range and a surface of the metallic member, the surface of the metallic member facing the surface of the electrode plate, wherein, when the metallic member is seen in a lamination direction of the electrode plate and the metallic member, an outer peripheral edge of a region of the metallic member, the region being connected with the solder, is arranged so as to go across the first set of second groove, the second set of second groove, the third set of second groove, and the fourth set of second groove, and wherein the electrode plate includes a flat surface in a center of the range, the flat surface not having the plurality of sets of second grooves.

2. A semiconductor device comprising:

an electrode plate, on a surface of which, a first groove having a rectangular ring shape and a plurality of sets of second grooves are provided, the first groove having a first linear part, a second linear part, a third linear part, and a fourth linear part extending along respective four sides of the rectangular ring shape, the plurality of sets of second grooves being arranged within a range surrounded by the fours sides of the first groove and having end portions on an outer periphery side that are connected with the first groove, each of the plurality of sets of second grooves including a plurality of second grooves, and the plurality of sets of second grooves including:
- a first set of second grooves having a plurality of second grooves connected with the first linear part of the first groove,
- a second set of second grooves having a plurality of second grooves connected with the second linear part of the first grooves,
- a third set of second grooves having a plurality of second grooves connected with the third linear part of the first groove, and
- a fourth set of second grooves having a plurality of second grooves connected with the fourth linear part of the first groove;

a metallic member; and solder that connects a surface of the electrode plate within the range and a surface of the metallic member, the surface of the metallic member facing the surface of the electrode plate, wherein, when the metallic member is seen in a lamination direction of the electrode plate and the metallic member, an outer peripheral edge of a region of the metallic member, the region being connected with the solder, is arranged so as to go across the first set of second groove, the second set of second groove, the third set of second groove, and the fourth set of second groove and, set of second groove, the third set of second groove, and the fourth set of second groove, and, and wherein the second grooves of the first set are not connected with the second grooves of the second to fourth sets, and the solder is covered by resin.

3. The semiconductor device according to claim 1 wherein each of the second grooves is connected perpendicularly with the first groove.

4. The semiconductor device according to claim 1 wherein a semiconductor chip is connected with a surface of the metallic member on the opposite side of the electrode plate through solder.

5. The semiconductor device according to claim 1, wherein the metallic member is a surface electrode of a semiconductor chip.

6. An electrode plate for connecting a semiconductor chip comprising:

an electrode plate, on a surface of which, a first groove and a plurality of sets of second grooves are provided, the first groove having a first linear part, a second linear part, a third linear part, and a fourth linear part extending along respective four sides of a rectangular ring shape, the plurality of sets of second grooves being arranged within a range surrounded by the respective four sides of the first groove and having end portions on an outer periphery side that are connected with the first groove, each of the plurality of sets of second grooves including a plurality of second grooves, the plurality of sets of second grooves including:
- a first set of second grooves having a plurality of second grooves connected with the first linear part of the first groove,
- a second set of second grooves having a plurality of second grooves connected with the second linear part of the first groove,
- a third set of second grooves having a plurality of second grooves connected with the third linear part of the first groove, and
- a fourth set of second grooves having the plurality of second grooves connected with the fourth linear part of the first groove, and the range being for joining a solder, wherein the electrode plate includes a flat surface in a center of the range, the flat surface not having the plurality of sets of second grooves.

* * * * *